United States Patent
Yokoyama et al.

(10) Patent No.: US 11,737,291 B2
(45) Date of Patent: Aug. 22, 2023

(54) SOLAR CELL

(71) Applicant: Panasonic Intellectual Property Management Co., Ltd., Osaka (JP)

(72) Inventors: Tomoyasu Yokoyama, Osaka (JP); Yu Nishitani, Osaka (JP); Shohei Kusumoto, Osaka (JP); Yumi Miyamoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 69 days.

(21) Appl. No.: 17/471,708

(22) Filed: Sep. 10, 2021

(65) Prior Publication Data

US 2021/0408413 A1 Dec. 30, 2021

Related U.S. Application Data

(63) Continuation of application No. PCT/JP2019/040826, filed on Oct. 17, 2019.

(30) Foreign Application Priority Data

Apr. 16, 2019 (JP) ................. 2019-078084

(51) Int. Cl.
*H10K 30/10* (2023.01)
*H10K 30/81* (2023.01)
*H10K 102/00* (2023.01)

(52) U.S. Cl.
CPC ............. *H10K 30/10* (2023.02); *H10K 30/81* (2023.02); *H10K 2102/00* (2023.02)

(58) Field of Classification Search
CPC ............. H01L 51/4213; H01L 51/4273; H01L 51/422; H10K 30/10; H10K 30/81; H10K 2102/00
See application file for complete search history.

(56) References Cited

U.S. PATENT DOCUMENTS

2015/0279573 A1* 10/2015 Horiuchi .............. H01G 9/2059
136/263
2015/0295194 A1 10/2015 Kanatzidis et al.
(Continued)

FOREIGN PATENT DOCUMENTS

JP 2017-017252 1/2017

OTHER PUBLICATIONS

Zhang, A highly crystalline Nb3O7F nanostructured photoelectrode: fabrication and photosensitization, J. Mater. Chem. A, 2013, 1, 6563-6570 (Year: 2013).*
(Continued)

*Primary Examiner* — Devina Pillay
(74) *Attorney, Agent, or Firm* — Greenblum & Bernstein, P.L.C.

(57) ABSTRACT

A solar cell according to the present disclosure includes a first electrode, a second electrode, a photoelectric conversion layer located between the first electrode and the second electrode, and a first electron transport layer located between the first electrode and the photoelectric conversion layer, in which at least one selected from the group consisting of the first electrode and the second electrode is translucent, the photoelectric conversion layer contains a perovskite compound composed of a monovalent cation, a Sn cation, and a halogen anion, and the first electron transport layer contains a niobium oxide halide.

12 Claims, 3 Drawing Sheets

(56) References Cited

U.S. PATENT DOCUMENTS

| | | | |
|---|---|---|---|
| 2016/0013434 A1 | 1/2016 | Snaith et al. | |
| 2016/0086739 A1* | 3/2016 | Burschka | H01G 9/0029 |
| | | | 438/82 |
| 2018/0019360 A1* | 1/2018 | Mishima | H01G 9/2009 |
| 2018/0240606 A1* | 8/2018 | Bawendi | H01L 51/424 |

OTHER PUBLICATIONS

Extended European Search Report issued in EP Patent Application No. 19925108.3., dated May 18, 2022.
Zhang Haimin et al: "A highly crystalline $Nb_3O_7F$ nanostructured photoelectrode: fabrication and photosensitisation", Journal of Materials Chemistry A, vol. 1, No. 22, Apr. 12, 2013 (Apr. 12, 2013), p. 6563, XP55918585.
International Search Report of PCT application No. PCT/JP2019/040826 dated Nov. 26, 2019.
Shihao Yuan et al., "$NbF_5$: A Novel α-Phase Stabilizer for FA-Based Perovskite Solar Cells with High Efficiency", Advanced Functional Materials, 1807850, Feb. 1, 2019.
Shuyan Shao et al., "Highly Reproducible Sn-Based Hybrid Perovskite Solar Cells with 9% Efficiency", Advanced Energy Materials, 2018, vol. 8, 1702019, Sep. 22, 2017.

* cited by examiner

SOLAR CELL

BACKGROUND

1. Technical Field

The present disclosure relates to a solar cell.

2. Description of the Related Art

In recent years, perovskite solar cells have been researched and developed. In perovskite solar cells, a perovskite compound represented by the chemical formula $ABX_3$ is used as a photoelectric conversion material, where A is a monovalent cation, B is a divalent cation, and each X is a halogen anion.

Tin-based perovskite solar cells containing tin-containing perovskite compounds represented by the chemical formula $CH_3NH_3SnI_3$ or $(NH_2)_2CHSnI_3$ as photoelectric conversion materials have been disclosed (see Japanese Unexamined Patent Application Publication No. 2017-17252 and Shuyan Shao et. al., "Highly Reproducible Sn-Based Hybrid Perovskite Solar Cells with 9% Efficiency", Advanced Energy Materia Is, 2018, Vol. 8, 1702019). A lead-based perovskite solar cell containing a $NbF_5$-added lead-based perovskite compound represented by the chemical formula $((NH_2)_2CH)_{0.85}(CH_3NH_3)_{0.15}PbI_3$ as a photoelectric conversion material has been disclosed (see S. Yuan et al., "NbF5: A Novel α-Phase Stabilizer for FA-Based Perovskite Solar Cells with High Efficiency", Adv. Func. Mater., 2019, 1807850).

SUMMARY

One non-limiting and exemplary embodiment provides a technique for increasing the conversion efficiency of a tin-based perovskite solar cell.

In one general aspect, the techniques disclosed here feature a solar cell including a first electrode, a second electrode, a photoelectric conversion layer located between the first electrode and the second electrode, and a first electron transport layer located between the first electrode and the photoelectric conversion layer, in which at least one selected from the group consisting of the first electrode and the second electrode is translucent, the photoelectric conversion layer contains a perovskite compound composed of a monovalent cation, a Sn cation, and a halogen anion, and the first electron transport layer contains a niobium oxide halide.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Definition of Terms

The term "perovskite compound" used in this specification refers to a perovskite crystal structure represented by the chemical formula $ABX_3$ (where A is a monovalent cation, B is a divalent cation, and each X is a halogen anion) and a structure having a crystal similar thereto. The term "tin-based perovskite compound" used in this specification refers to a perovskite compound containing a Sn cation as a divalent cation.

The term "perovskite solar cell" used in this specification refers to a solar cell containing a perovskite compound as a photoelectric conversion material. The term "tin-based perovskite solar cell" used in this specification refers to a solar cell containing a tin-based perovskite compound as a photoelectric conversion material.

Underlying Knowledge Forming Basis of the Present Disclosure

The underlying knowledge forming the basis of the present disclosure will be described below.

Tin-based perovskite compounds have a band gap of about 1.4 eV, which is theoretically suitable as a photoelectric conversion material for solar cells. Based on the value of the band gap, tin-based perovskite solar cells should exhibit high conversion efficiency. The conversion efficiency of tin-based perovskite solar cells of the related art is, however, lower than that of lead-based perovskite solar cells containing lead-based perovskite compounds as photoelectric conversion materials. Lead-based perovskite compounds are perovskite compounds containing Pb cations as divalent cations.

Figure 1:
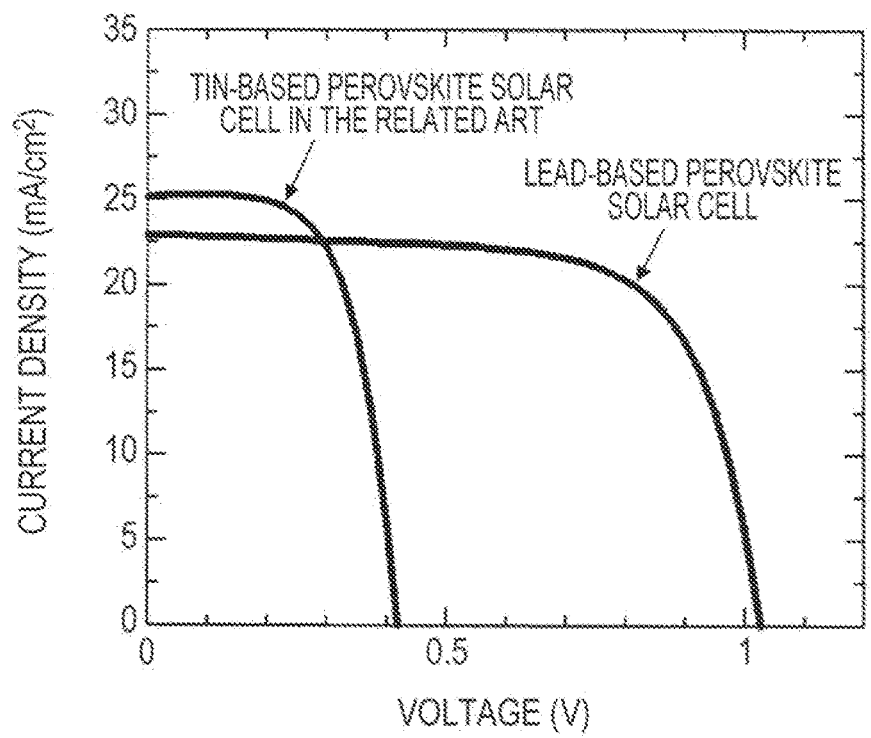
FIG. 1 is a graph illustrating the current-voltage characteristics based on actual measurements of a lead-based perovskite solar cell and a tin-based perovskite solar cell of the related art.

FIG. 1 is a graph illustrating the current-voltage characteristics based on actual measurements of a lead-based perovskite solar cell and a tin-based perovskite solar cell of the related art. Each solar cell used for the measurement of the actual values was produced by the inventors. Each solar cell had a stacked structure including a substrate, a first electrode, an electron transport layer, a porous layer, a photoelectric conversion layer, a hole transport layer, and a second electrode stacked in that order. The layers of each solar cell are composed of materials described below.

Lead-Based Perovskite Solar Cell
    Substrate: glass
First electrode: mixture of indium-tin composite oxide (hereinafter, referred to as "ITO") and antimony-doped tin oxide (hereinafter, referred to as "ATO").
Electron transport layer: compact $TiO_2$ (hereinafter, referred to as "c-$TiO_2$")
Porous layer: mesoporous $TiO_2$ (hereinafter, referred to as "mp-$TiO_2$")
Photoelectric conversion layer: $HC(NH_2)_2PbI_3$
Hole transport layer: (2,2',7,7'-tetrakis(N,N-di-p-methoxyphenylamine)-9,9'-spirobifluorene) (hereinafter, referred to as "spiro-OMeTAD")
Second electrode: gold
Tin-Based Perovskite Solar Cell of the Related Art
    Substrate: glass
First electrode: mixture of ITO and ATO Electron transport layer: c-TiO$_2$
Porous layer: mp-TiO$_2$
Photoelectric conversion layer: HC(NH$_2$)$_2$SnI$_3$
Hole transport layer: (poly[bis(4-phenyl)(2,4,6-trimethylphenyl)amine]) (hereinafter, referred to as "PTAA")
Second electrode: gold As illustrated in FIG. 1, a tin-based perovskite solar cell of the related art has a lower open-circuit voltage than a lead-based perovskite solar cell. This low open-circuit voltage is presumed to be a cause of the low conversion efficiency of tin-based perovskite solar cells of the related art. The inventors have focused on the difference in energy level of the conduction band minimum between the tin-based perovskite compound and the electron transport material contained in the electron transport layer, as a cause of the low conversion efficiency of the tin-based perovskite solar cell of the related art. When the energy level difference is large, a state in which carrier recombination proceeds at the interface between the photoelectric conversion layer and the electron transport layer is assumed. In this specification, hereinafter, "the difference between the energy level $E_{pec}$ of the conduction band minimum of the photoelectric conversion material contained in the photoelectric conversion layer and the energy level $E_{et}$ of the conduction band minimum of the electron transport material contained in the electron transport layer" is referred to as an "energy offset". The energy offset is a value obtained by subtracting the energy level $E_{pec}$ from the energy level $E_{et}$. The value of the "energy level of the conduction band minimum" in this specification is based on the vacuum level.

The energy level of the conduction band minimum of a tin-based perovskite compound is, for example, −3.5 eV. The energy level of the conduction band minimum of a lead-based perovskite compound is, for example, −4.0 eV.

That is, the energy level of the conduction band minimum of the tin-based perovskite compound is shallower than the energy level of the conduction band minimum of the lead-based perovskite compound. Thus, when the same electron transport layer as that of the lead-based perovskite solar cell is used in the tin-based perovskite solar cell, an energy difference based on energy offset occurs at the interface between the electron transport layer and the photoelectric conversion layer. A typical electron transport material used in the lead-based perovskite solar cell is TiO$_2$. The energy level of the conduction band minimum of TiO$_2$ is −4.0 eV. In other words, there is an energy offset of −0.5 eV between the tin-based perovskite compound and the electron transport material, TiO$_2$. The energy difference based on the energy offset increases the probability of the existence of electrons near the interface. This increases the carrier recombination probability at the interface, resulting in a loss of the open-circuit voltage. In other words, when the same electron transport layer as in the lead-based perovskite solar cell is used in the tin-based perovskite solar cell, the open-circuit voltage is low, decreasing the conversion efficiency.

Figure 2:
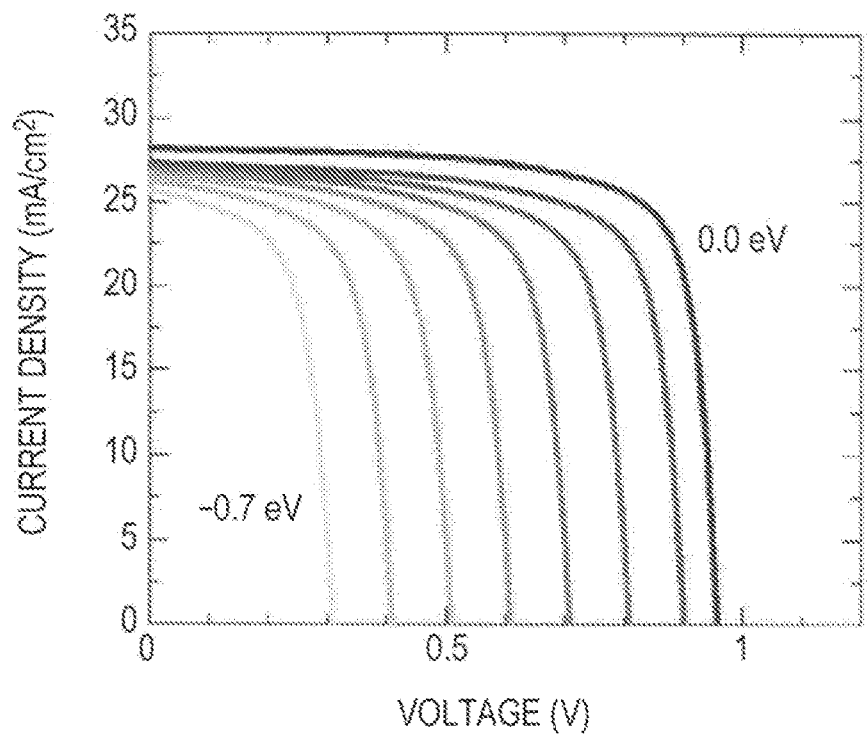
FIG. 2 is a graph illustrating the relationship between the current-voltage characteristics and the energy offset of a solar cell based on a device simulation.

FIG. 2 is a graph illustrating the relationship between the current-voltage characteristics of a solar cell and the energy offset based on device simulation. For the device simulation, a solar cell capacitance simulator (SCAPS) was used. FIG. 2 illustrates the current-voltage characteristics when the energy offset is set to 0.0 eV, −0.1 eV, −0.2 eV, −0.3 eV, −0.4 eV, −0.5 eV, −0.6 eV, and −0.7 eV, in that order from the right of the graph. FIG. 2 indicates that a smaller energy offset improves the conversion efficiency of the solar cell. Increasing the conversion efficiency of the tin-based perovskite solar cell requires an electron transport material that can achieve a small energy offset between the tin-based perovskite compound and the electron transport material.

The inventors have found the use of a niobium oxide halide as an electron transport material contained in the electron transport layer of the tin-based perovskite solar cell. The niobium oxide halide has an electron affinity close to that of the tin-based perovskite compound. Thus, a small energy offset can be achieved between the tin-based perovskite compound and the niobium oxide halide. Accordingly, the use of the niobium oxide halide as an electron transport material enables an improvement in the conversion efficiency of the tin-based perovskite solar cell.

Embodiments of the Present Disclosure

Embodiments of the present disclosure will be described below with reference to the drawings.

Figure 3:
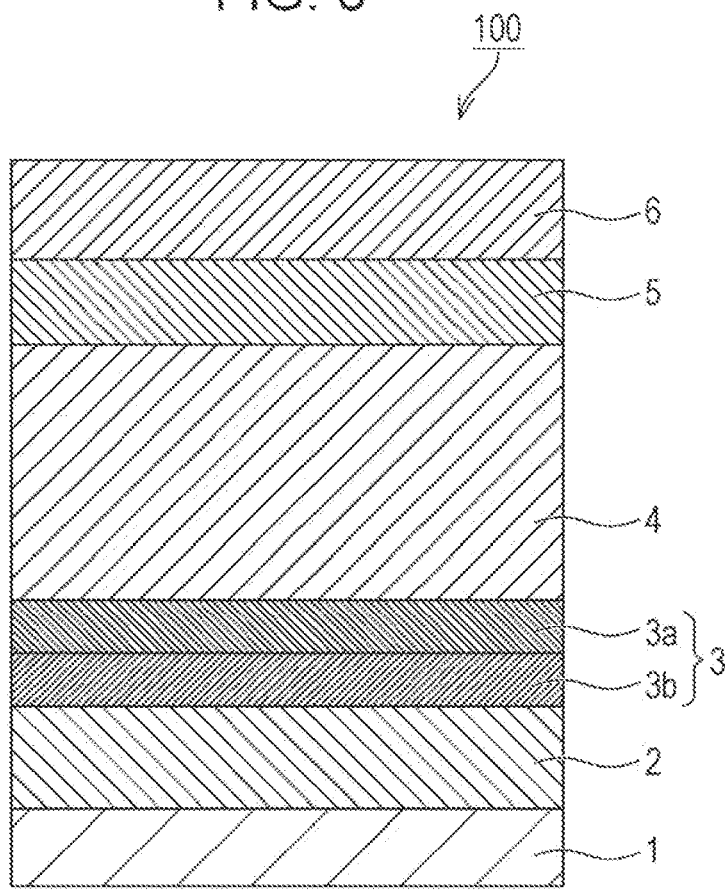
FIG. 3 is a cross-sectional view of a solar cell according to an embodiment of the present disclosure.

FIG. 3 is a cross-sectional view of a solar cell according to an embodiment. As illustrated in FIG. 3, a solar cell 100 according to this embodiment includes a first electrode 2, a second electrode 6, a photoelectric conversion layer 4, and a first electron transport layer 3a. The photoelectric conversion layer 4 is located between the first electrode 2 and the second electrode 6. The first electron transport layer 3a is located between the first electrode 2 and the photoelectric conversion layer 4. The first electrode 2 is opposite the second electrode 6 in such a manner that the first electron transport layer 3a and the photoelectric conversion layer 4 are disposed between the first electrode 2 and the second electrode 6. At least one electrode selected from the group consisting of the first electrode 2 and the second electrode 6 is translucent. In this specification, the phrase "the electrode is translucent" indicates that 10% or more of light having a wavelength of greater than or equal to 200 nm and less than or equal to 2,000 nm is transmitted through the electrode at a specific wavelength.

The first electron transport layer 3a contains a niobium oxide halide. More specifically, the first electron transport layer 3a contains the electron transport material containing the niobium oxide halide. Hereinafter, the electron transport material contained in the first electron transport layer 3a will be referred to as a "first electron transport material".

The energy level of the conduction band minimum of the first electron transport material may be greater than −3.9 eV. The energy level may be less than −3.1 eV, or may be greater than −3.9 eV and less than −3.1 eV.

The absolute value of the energy offset between the first electron transport material and the photoelectric conversion material contained in the photoelectric conversion layer 4 may be less than or equal to 0.3 eV or may be less than 0.3 eV. When the absolute value of the energy offset is less than or equal to 0.3 eV, the solar cell should exhibit high conversion efficiency. A high-conversion-efficiency solar cell can exhibit current-voltage characteristics, for example, with a voltage of 0.7 V and a current density of greater than or equal to 27 mA/cm$^2$.

The niobium oxide halide contained in the first electron transport material can contain, as a halogen, at least one element selected from the group consisting of fluorine (i.e., F), chlorine (i.e., Cl), and bromine (i.e., Br). The halogen is at least one selected from the group consisting of F and Cl. The halogen is desirably F.

The niobium oxide halide may have a composition represented by the composition formula Nb$_{2(1+a)}$O$_{5(1-a-b)}$X$_{10b}$, where X is a halogen, examples of the halogen are as described above, a may be greater than or equal to −0.05 and less than or equal to 0.05, and b may be greater than or equal to 0.05 and less than or equal to 0.95, provided that the sum of a and b is less than 1.

The composition ratio Nb/O of niobium to oxygen in the niobium oxide halide may be greater than or equal to 0.36 and less than or equal to 0.43. The composition ratio X/Nb of halogen to niobium in the niobium oxide halide may be greater than or equal to 0.006. The composition ratio is expressed by a mole ratio. When the niobium oxide halide satisfies at least one of the group consisting of the above composition ratio Nb/O and the above composition ratio X/Nb, the tin-based perovskite solar cell can have more reliably improved conversion efficiency. The composition of the niobium oxide halide and the above composition ratio can be evaluated by various analytical methods, such as X-ray photoelectron spectroscopy (hereinafter, referred to as "XPS"), energy-dispersive X-ray analysis (hereinafter, referred to as "EDX"), ICP emission spectroscopy, and Rutherford backscattering spectrometry (hereinafter, referred to as "RBS").

The first electron transport material may contain another substance other than the niobium oxide halide. An example of the another substance is niobium oxide. In other words, the first electron transport material may contain the niobium oxide halide and niobium oxide. However, the another substance is not limited to the above example. The first electron transport material may mainly contain the niobium oxide halide or may consist essentially of the niobium oxide halide. In this specification, the expression "mainly contain" a substance indicates that the amount of the substance contained is greater than or equal to 50% by mole, or the amount of the substance contained may be greater than or equal to 60% by mole. In this specification, the expression "consist essentially of" a substance indicates that the amount of the substance contained is greater than or equal to 90% by mole, or the amount of the substance contained may be greater than or equal to 95% by mole. The first electron transport material may consist of the niobium oxide halide. The composition of niobium oxide that can be contained in the first electron transport material can be the same as the composition of niobium oxide described in the description of a second electron transport layer 3b below.

The halogen concentration at a surface of the first electron transport layer 3a adjacent to the photoelectric conversion layer 4 may be higher than the halogen concentration at a surface adjacent to the first electrode 2. The surface adjacent to the first electrode 2 is, for example, an interface with the second electron transport layer 3b. The surface adjacent to the photoelectric conversion layer 4 is, for example, an interface with the photoelectric conversion layer 4. The first electron transport layer 3a may have a concentration gradient in which the halogen concentration decreases in the direction from the photoelectric conversion layer 4 toward the first electrode 2 in at least a portion of a region of the first electron transport layer 3a extending in the thickness direction. The first electron transport layer 3a may have the above concentration gradient over the entire region of the first electron transport layer 3a extending in the thickness direction. In this case, the halogen concentration in the first electron transport layer 3a decreases from the surface adjacent to the photoelectric conversion layer 4 toward the surface adjacent to the first electrode 2. In the first electron transport material containing the niobium oxide halide, a lower halogen concentration tends to result in higher electron mobility. Thus, when the first electron transport layer 3a has the above form, the tin-based perovskite solar cell can have more reliably improved conversion efficiency.

A typical change in halogen concentration in the first electron transport layer 3a is described below.

From the surface adjacent to the photoelectric conversion layer 4 toward the surface adjacent to the first electrode 2, the halogen concentration increases, reaches the peak, and then decreases. A region closer to the first electrode 2 than the peak has the concentration gradient in which the halogen concentration decreases.

The position where the halogen concentration reaches the peak is closer to the photoelectric conversion layer 4 than the center of the first electron transport layer 3a in the thickness direction. In other words, from the surface adjacent to the photoelectric conversion layer 4 toward the surface adjacent to the first electrode 2, the halogen concentration increases, reaches the peak, and then decreases more gradually than the increase.

In this typical change in concentration, the halogen concentration at the surface adjacent to the photoelectric conversion layer 4 may be higher than the halogen concentration at the surface adjacent to the first electrode 2. In other words, the first electron transport layer has two main surfaces, one of the two main surfaces facing the photoelectric conversion layer, the other main surface of the two main surfaces facing the first electrode, and the one main surface has a higher halogen concentration than the other main surface.

On the surface of the first electron transport layer 3a adjacent to the photoelectric conversion layer 4, at least one selected from the group consisting of the above-mentioned range of the composition ratio Nb/O of niobium to oxygen and the above-mentioned range of the composition ratio X/Nb of the halogen to niobium is satisfied.

When the first electron transport material contains the another substance, the first electron transport layer 3a may have a higher niobium oxide halide content at the surface adjacent to the photoelectric conversion layer 4 than the niobium oxide halide content at the surface adjacent to the first electrode 2.

The first electron transport layer 3a may be formed of multiple layers having the same composition or multiple layers having different compositions from each other. In the case where the first electron transport layer 3a is formed of multiple layers, in the layer adjacent to the photoelectric conversion layer 4, at least one selected from the group consisting of the above-mentioned range of the composition ratio Nb/O of niobium to oxygen and the above-mentioned range of the composition ratio X/Nb of the halogen to niobium is satisfied.

The first electron transport layer 3a may have a thickness of greater than or equal to 2 nm and less than or equal to 350 nm. The first electron transport layer 3a having a thickness within this range can have sufficient electron transportability and can maintain low resistance. The first electron transport layer 3a may have a thickness of greater than or equal to 5 nm and less than or equal to 350 nm, or greater than or equal to 50 nm and less than or equal to 350 nm.

The first electron transport layer 3a may be in contact with the photoelectric conversion layer 4.

The solar cell 100 illustrated in FIG. 3 includes the first electrode 2, the second electron transport layer 3b, the first electron transport layer 3a, the photoelectric conversion layer 4, a hole transport layer 5, and the second electrode 6 stacked, in that order, on a substrate 1. In this solar cell 100, the first electron transport layer 3a is in contact with the photoelectric conversion layer 4 and the second electron transport layer 3b. The first electron transport layer 3a and the second electron transport layer 3b function as the electron transport layer 3. In the solar cell of the present disclosure, the second electrode 6, the hole transport layer 5, the photoelectric conversion layer 4, the first electron transport layer 3a, the second electron transport layer 3b, and the first electrode 2 may be stacked on the substrate 1 in that order. The solar cell of the present disclosure need not include the substrate 1. The solar cell of the present disclosure need not include the second electron transport layer 3b. In this case, the first electron transport layer 3a functions as the electron transport layer 3. The solar cell of the present disclosure need not include the hole transport layer 5.

The basic operation and effect of the solar cell 100 will be described. When the solar cell 100 is irradiated with light, the photoelectric conversion layer 4 absorbs the light to generate excited electrons and holes. The excited electrons move to the first electron transport layer 3a. The holes move to the hole transport layer 5. The first electron transport layer 3a and the hole transport layer 5 are electrically coupled to the first electrode 2 and the second electrode 6, respectively, directly or through another layer. Current is drawn from the first electrode 2 serving as a negative electrode and the second electrode 6 serving as a positive electrode.

Hereinafter, each component of solar cell 100 will be specifically described.

Second Electron Transport Layer 3b

The solar cell 100 illustrated in FIG. 3 further includes the second electron transport layer 3b between the first electrode 2 and the first electron transport layer 3a. In this solar cell 100, the second electron transport layer 3b is in contact with the first electrode 2. However, a layer having a different function may be disposed between the second electron transport layer 3b and the first electrode 2. The second electron transport layer 3b contains niobium oxide. The second electron transport layer 3b need not contain the niobium oxide halide. More specifically, the second electron transport layer 3b contains an electron transport material containing niobium oxide. Hereinafter, the electron transport material contained in the second electron transport layer 3b is referred to as a "second electron transport material".

The energy level of the conduction band minimum of the second electron transport material may be greater than −3.9 eV. The energy level may be less than −3.1 eV or may be greater than −3.9 eV and less than −3.1 eV. The energy level of the conduction band minimum of the second electron transport material may be larger than the energy level of the conduction band minimum of the first electron transport material.

The absolute value of the energy offset between the second electron transport material and the photoelectric conversion material contained in the photoelectric conversion layer 4 may be less than or equal to 0.3 eV or may be less than 0.3 eV. The absolute value of the energy offset between the second electron transport material and the photoelectric conversion material may be greater than the absolute value of the energy offset between the first electron transport material and the photoelectric conversion material.

Niobium oxide contained in the second electron transport material may have a composition represented by the composition formula $Nb_{2(1+c)}O_{5(1-c)}$, where c may be greater than or equal to 0.05 and less than or equal to 0.50.

The composition ratio Nb/O of niobium to oxygen in the niobium oxide may be greater than or equal to 0.36 and less than or equal to 0.43. The composition ratio is expressed by a mole ratio. When the niobium oxide satisfies the above-mentioned composition ratio Nb/O, the tin-based perovskite solar cell can have more reliably improved conversion efficiency. The composition of the niobium oxide and the above-mentioned composition ratio can be evaluated by various analytical methods, such as XPS, EDX, ICP emission spectroscopy, and RBS.

The second electron transport material may contain another substance other than niobium oxide. The second electron transport material may mainly contain the niobium oxide or may consist essentially of the niobium oxide. The second electron transport material may consist of the niobium oxide.

The another substance that can be contained in the second electron transport material is usually a semiconductor. The another substance that can be contained in the second electron transport material is, for example, Semiconductor S1 having a band gap of greater than or equal to 3.0 eV. In the case where the second electron transport material contains Semiconductor S1, the transmission of the visible and infrared light to the photoelectric conversion layer 4 through the second electron transport layer 3b is more reliable. Examples of Semiconductor S1 include n-type organic semiconductors and n-type inorganic semiconductors.

Examples of n-type organic semiconductors include imide compounds, quinone compounds, fullerenes, and derivatives thereof. Examples of n-type inorganic semiconductors include oxides of metal elements, nitrides of metal elements, and perovskite oxides. Examples of oxides of metal elements include an oxide of at least one metal selected from the group consisting of Cd, Zn, In, Pb, Mo, W, Sb, Bi, Cu, Hg, Ti, Ag, Mn, Fe, V, Sn, Zr, Sr, Ga, and Cr. A specific example of oxides of metal elements is $TiO_2$. An example of nitrides of metal elements is GaN. Examples of perovskite oxides include $SrTiO_3$ and $CaTiO_3$.

Semiconductor S1 may be contained in the first electron transport material.

The second electron transport layer 3b may be formed of multiple layers having the same composition or multiple layers having different compositions from each other.

The second electron transport layer 3b may have a thickness of greater than or equal to 2 nm and less than or equal to 350 nm. The second electron transport layer 3b having a thickness within this range can have sufficient electron transportability and can maintain low resistance. The second electron transport layer 3b may have a thickness of greater than or equal to 5 nm and less than or equal to 350 nm, or greater than or equal to 50 nm and less than or equal to 350 nm.

The ratio of the thickness $t_1$ of the first electron transport layer 3a to the thickness $t_2$ of the second electron transport layer 3b, $t_1/t_2$, may be greater than or equal to 0.01 and less than or equal to 1.0 or may be greater than or equal to 0.5 and less than or equal to 0.8. In the case where the ratio $t_1/t_2$ is in these ranges, the above effects based on a reduction in energy offset can be provided, and the electron transport layer including both the electron transport layer 3a and 3b can have improved electronic conductivity, as a whole.

Substrate 1

The substrate 1 supports the layers included in the solar cell 100. The substrate 1 can be formed of a transparent material. Examples of the substrate 1 include a glass substrate and a plastic substrate. The plastic substrate can be a plastic film. The solar cell 100 need not include the substrate 1 when the first electrode 2 has sufficient strength to support the layers.

First Electrode 2 and Second Electrode 6

The first electrode 2 and the second electrode 6 are conductive. At least one electrode selected from the group consisting of the first electrode 2 and the second electrode 6 is translucent. The translucent electrode can transmit light belonging to, for example, the visible to near-infrared region. The translucent electrode can be composed of, for example, at least one compound selected from the group consisting of metal oxides and metal nitrides that are transparent and conductive. Examples of transparent and conductive metal oxides and metal nitrides include (i) titanium oxide doped with at least one element selected from the group consisting of lithium, magnesium, niobium, and fluorine; (ii) gallium oxide doped with at least one element selected from the group consisting of tin and silicon; (iii) gallium nitride doped with at least one element selected from the group consisting of silicon and oxygen; (iv) indium-tin composite oxide; (v) tin oxide doped with at least one element selected from the group consisting of antimony and fluorine; (vi) zinc oxide doped with at least one element selected from the group consisting of boron, aluminum, gallium, and indium; and (vii) composites thereof.

The translucent electrode may be an electrode that is composed of a non-transparent material and that has a pattern shape through which light can be transmitted. Examples of the pattern shape through which light can be transmitted include line (striped) shapes, wavy-line shapes, grid (mesh) shapes, and perforated metal shapes with a large number of fine through-holes arranged regularly or irregularly. In the electrode having the above-mentioned pattern shape, light can be transmitted through an opening portion where the electrode material is not disposed. Examples of non-transparent material include platinum, gold, silver, copper, aluminum, rhodium, indium, titanium, iron, nickel, tin, zinc, and alloys containing any of these materials. The material may be an electrically conductive carbon material.

The solar cell 100 includes the first electron transport layer 3a between the first electrode 2 and the photoelectric conversion layer 4. For this reason, the first electrode 2 need not have the property of blocking holes moving from the photoelectric conversion layer 4. The first electrode 2 can be composed of a material that can form an ohmic contact with the photoelectric conversion layer 4.

In the case where the solar cell 100 does not include the hole transport layer 5, the second electrode 6 has the property of blocking electrons moving from the photoelectric conversion layer 4 (hereinafter, referred to as "electron-blocking properties"). In this case, the second electrode 6 does not form an ohmic contact with the photoelectric conversion layer 4. In this specification, the term "electron-blocking properties" indicates that only holes generated in the photoelectric conversion layer 4 are allowed to pass therethrough, and electrons are not allowed to pass therethrough. The Fermi energy level of the material having the electron-blocking properties is lower than the energy level of the conduction band minimum of the photoelectric conversion layer 4. The Fermi energy level of the material having the electron-blocking properties may be lower than the Fermi energy level of the photoelectric conversion layer 4. Examples of the material having the electron-blocking properties include platinum, gold, and carbon materials, such as graphene. These materials do not transmit light. Accordingly, when these materials are used to form translucent electrodes, for example, electrodes having a pattern shape as described above are used.

In the case where the solar cell 100 includes the hole transport layer 5 between the second electrode 6 and the photoelectric conversion layer 4, the second electrode 6 need not have the electron-blocking properties. In this case, the second electrode 6 can be composed of a material that can form an ohmic contact with the photoelectric conversion layer 4.

The light transmittance of each of the first electrode 2 and the second electrode 6 may be greater than or equal to 50%, or may be greater than or equal to 80%. The wavelength of the light transmitted through the electrodes depends on the absorption wavelength of the photoelectric conversion layer 4. Each of the first electrode 2 and the second electrode 6 has a thickness of, for example, greater than or equal to 1 nm and less than or equal to 1,000 nm.

Photoelectric Conversion Layer 4

The photoelectric conversion layer 4 contains a perovskite compound as a photoelectric conversion material containing a monovalent cation, a divalent cation, and a halogen anion. The perovskite compound refers to a perovskite crystal structure represented by the chemical formula $ABX_3$ and a structure having a crystal similar thereto. A is a monovalent cation, B is a divalent cation, and each X is a halogen anion.

Examples of the monovalent cation A include alkali metal cations and organic cations. The cation A may be at least one selected from the group consisting of a methylammonium cation ($CH_3NH_3^+$), a formamidinium cation ($NH_2CHNH_2^+$), a cesium cation ($Cs^+$), a phenylethylammonium cation ($C_6H_5C_2H_4NH_3^+$), and a guanidinium cation ($CH_6N_3^+$). The cation A may be a formamidinium cation. The perovskite compound may contain multiple types of cations A, in which case the formamidinium cations may be mainly contained.

The divalent cation B is a Sn cation. The perovskite compound may contain a divalent cation B other than the Sn cation. In this case, usually, the Sn cation is mainly contained.

Each anion X is, for example, an iodide ion. The perovskite compound may contain multiple types of anions X, in which case the iodide ions may be mainly contained.

The photoelectric conversion layer 4 may mainly contain a perovskite compound. In this case, the photoelectric conversion layer 4 may have a perovskite compound content of, for example, greater than or equal to 50% by mass, greater than or equal to 70% by mass, or greater than or equal to 80% by mass. In this case, the photoelectric conversion layer 4 may further contain a compound other than the perovskite compound. An example of the compound other than the perovskite compound is a quencher substance for reducing the defect density in the perovskite compound. An example of the quencher substance is a fluorine compound. An example of the fluorine compound is tin fluoride. The photoelectric conversion layer 4 may contain impurities.

The photoelectric conversion layer 4 has a thickness of, for example, greater than or equal to 100 nm and less than or equal to 10 µm. The photoelectric conversion layer 4 may have a thickness of greater than or equal to 100 nm and less than or equal to 1,000 nm. The thickness of the photoelectric conversion layer 4 can depend on the amount of light absorbed by the photoelectric conversion layer 4.

Hole Transport Layer 5

The solar cell 100 illustrated in FIG. 3 further includes the hole transport layer 5 between the second electrode 6 and the photoelectric conversion layer 4. The hole transport layer 5 is composed of, for example, an organic semiconductor or an inorganic semiconductor. The hole transport layer 5 may have multiple layers composed of different materials from each other.

Examples of organic semiconductors include phenylamines and triphenylamine derivatives containing tertiary amines in their skeletons; and PEDOT compounds containing thiophene structures. The molecular weight of such an organic semiconductor is not limited. The organic semiconductor may be a polymer. Typical examples of the organic semiconductor include (i) spiro-OMeTAD, (ii) PTAA, (iii)

P3HT: poly(3-hexylthiophene-2,5-diyl), (iv) PEDOT: poly(3,4-ethylenedioxythiophene), and (v) CuPC: Copper(II) phthalocyanine, triple-sublimed grade.

Examples of inorganic semiconductors include $Cu_2O$, $CuGaO_2$, CuSCN, CuI, $NiO_x$, $MoO_x$, $V_2O_5$, and carbonaceous material, such as graphene oxide.

The hole transport layer 5 may have a thickness of greater than or equal to 1 nm and less than or equal to 1,000 nm, greater than or equal to 10 nm and less than or equal to 500 nm, or greater than or equal to 10 nm and less than or equal to 50 nm. The hole transport layer 5 having a thickness within this range may have high hole transportability.

The hole transport layer 5 may contain a supporting electrolyte and a solvent. The supporting electrolyte and solvent can stabilize holes in the hole transport layer 5.

Examples of the supporting electrolyte include ammonium salts and alkali metal salts. Examples of ammonium salts include tetrabutylammonium perchlorate, tetraethylammonium hexafluorophosphate, imidazolium salts, and pyridinium salts. Examples of alkali metal salts include LiN$(SO_2C_nF_{2n+1})_2$, $LiPF_6$, $LiBF_4$, lithium perchlorate, and potassium tetrafluoroborate.

The solvent that can be contained in the hole transport layer 5 may have high ionic conductivity. The solvent may be any of aqueous solvents and organic solvents. From the viewpoint of stabilizing the solute, the solvent may be an organic solvent. Examples of the organic solvent include heterocyclic compounds, such as tert-butylpyridine, pyridine, and n-methylpyrrolidone.

The solvent that can be contained in the hole transport layer 5 may be an ionic liquid. The ionic liquid can be used alone or as a mixture in combination with another solvent. The ionic liquid has the advantages of low volatility and high flame retardancy.

Examples of the ionic liquid include imidazolium compounds, such as 1-ethyl-3-methylimidazolium tetracyanoborate, pyridine compounds, alicyclic amine compounds, aliphatic amine compounds, and azonium amine compounds.

The solar cell in the present disclosure can have another layer other than those mentioned above, as long as the operation and effect of the present disclosure are achieved.

The solar cell 100 is produced, for example, by the following method.

The first electrode 2 is formed on a surface of the substrate 1. For the formation of the first electrode 2, a chemical vapor deposition (hereinafter, referred to as "CVD") method or a sputtering method can be employed.

The second electron transport layer 3b is formed on the first electrode 2. For the formation of the second electron transport layer 3b, an application method, such as a spin coating method, or a sputtering method can be employed. When the second electron transport layer 3b is formed by the application method, for example, a solution of a niobium oxide raw material dissolved in a solvent at a predetermined proportion is applied onto the first electrode 2 by the application method, such as the spin coating method. The formed coating film can be heat-treated in air at a predetermined temperature. The predetermined temperature is, for example, higher than or equal to 30° C. and lower than or equal to 1,500° C. The predetermined temperature may be higher than 300° C. Examples of the raw-material niobium oxide include (i) niobium halides, such as niobium fluoride, niobium chloride, niobium bromide, and niobium iodide; (ii) niobium oxide halides, such as niobium oxide chloride, niobium oxide bromide, and niobium oxide iodide; (iii) niobium alkoxides, such as niobium ethoxide; and (iv) niobium ammonium oxalate and niobium hydrogen oxalate. Examples of the solvent include isopropyl alcohol and ethyl alcohol.

The first electron transport layer 3a is formed on the second electron transport layer 3b. For the formation of the first electron transport layer 3a, an application method, such as a spin coating method, or a sputtering method can be employed. When the first electron transport layer 3a is formed by the application method, for example, a solution of a raw-material niobium oxide halide dissolved in a solvent at a predetermined proportion is applied onto the second electron transport layer 3b by the application method, such as the spin coating method. The formed coating film can be heat-treated in air at a predetermined temperature. The predetermined temperature is, for example, higher than or equal to 30° C. and lower than or equal to 300° C. Examples of the raw-material niobium include (i) niobium halides, such as niobium fluoride, niobium chloride, niobium bromide, and niobium iodide; and (ii) niobium oxide halides, such as niobium oxide chloride, niobium oxide bromide, and niobium oxide iodide. Examples of the solvent include isopropyl alcohol and ethyl alcohol.

The photoelectric conversion layer 4 is formed on the first electron transport layer 3a. For the formation of the photoelectric conversion layer 4 containing the perovskite compound as a photoelectric conversion material, an application method, such as a spin coating method, can be employed. A specific example of a method for forming the photoelectric conversion layer 4 is described below. In one example, the photoelectric conversion layer containing a tin-based perovskite compound represented by the chemical formula $(HC(NH_2)_2)_{1-y-z}(C_6H_5CH_2CH_2NH_3)_y(CH_6N_3)_zSnI_3$ is formed. In the above formula, y and z satisfy $0<y$, $0<z$, and $0<y+z<1$.

$SnI_2$, $HC(NH_2)_2I$ (hereinafter, referred to as "FAI"), $C_6H_5CH_2CH_2NH_3I$ (hereinafter, referred to as "PEAI"), and $CH_6N_3I$ (hereinafter, referred to as "GAI"), which are raw materials, are added to an organic solvent. An example of the organic solvent is a mixture of dimethyl sulfoxide (hereinafter, referred to as "DMSO") and N,N-dimethylformamide (hereinafter, referred to as "DMF"). The mixing ratio of DMSO to DMF in the solvent mixture is, for example, 1:1 by volume. The amount of $SnI_2$ added may be greater than or equal to 0.8 mol/L and less than or equal to 2.0 mol/L, or greater than or equal to 0.8 mol/L and less than or equal to 1.5 mol/L. The amount of FAI added may be greater than or equal to 0.8 mol/L and less than or equal to 2.0 mol/L, or greater than or equal to 0.8 mol/L and less than or equal to 1.5 mol/L. The molarity of PEAI in the coating solution may be greater than or equal to 0.1 mol/L and less than or equal to 0.6 mol/L, or greater than or equal to 0.3 mol/L and less than or equal to 0.5 mol/L. The molarity of GAI in the coating solution may be greater than or equal to 0.1 mol/L and less than or equal to 0.6 mol/L, or greater than or equal to 0.3 mol/L and less than or equal to 0.5 mol/L.

The coating solution containing $SnI_2$, FAI, PEAI, and GAI is heated to a temperature of higher than or equal to 40° C. and lower than or equal to 180° C. Thereby, $SnI_2$, FAI, PEAI, and GAI are dissolved in the solvent mixture to form the coating solution. The resulting coating solution can be allowed to stand at room temperature.

The coating solution is applied by the spin coating method onto the first electron transport layer 3a. The coating film on the first electron transport layer 3a is heat-treated. This forms the photoelectric conversion layer 4. The heat-treatment temperature of the coating film is, for example, higher than or equal to 40° C. and lower than or equal to 100° C.

The heat-treatment time of the coating film is, for example, greater than or equal to 15 minutes and less than or equal to 1 hour. In the application by the spin coating method, a poor solvent can be dropped during the spin coating. Examples of the poor solvent include toluene, chlorobenzene, and diethyl ether.

The coating solution may contain a quenching substance, such as tin fluoride, in a concentration of greater than or equal to 0.05 mol/L and less than or equal to 0.4 mol/L. The use of the coating solution containing the quencher substance enables the formation of the photoelectric conversion layer 4 with only a few defects. An example of the defects in the photoelectric conversion layer 4 is Sn vacancies increased by the increase of $Sn^{4+}$.

The hole transport layer 5 is formed on the photoelectric conversion layer 4. For the formation of the hole transport layer 5, an application method or a printing method can be employed. Examples of the application method include a doctor blade method, a bar coating method, a spraying method, a dip coating method, and a spin coating method. An example of the printing method is a screen printing method. A film composed of a mixture of multiple materials is formed and then pressurized or heat-treated to form the hole transport layer 5. The hole transport layer 5 composed of an organic low-molecular-weight substance or an inorganic semiconductor may be formed by a vacuum deposition method.

The second electrode 6 is formed on the hole transport layer 5. For the formation of the second electrode 6, a CVD method or a sputtering method can be employed.

In this way, the solar cell 100 is produced. However, the method for producing the solar cell 100 is not limited to the above embodiments.

EXAMPLES

A solar cell of the present disclosure will be described in more detail below with reference to examples. However, the solar cell of the present disclosure is not limited to structures described in the examples below.

Example 1

A tin-based perovskite solar cell having the same structure as the solar cell 100 illustrated in FIG. 3 was produced. Elements included in the solar cell of Example 1 are described below.
Substrate 1: glass substrate
First electrode 2: indium-doped $SnO_2$ layer (surface resistivity: 10 Ω/sq)
Second electron transport layer 3b: niobium oxide layer (thickness: 10 nm)
First electron transport layer 3a: niobium oxide fluoride layer (thickness: 8 nm)
Photoelectric conversion layer 4: layer mainly containing $HC(NH_2)_2SnI_3$
Hole transport layer 5: PTAA layer (thickness: 10 nm)
Second electrode 6: gold layer (thickness: 120 nm)

A specific production method is described below.

A conductive glass substrate (available from Nippon Sheet Glass Co., Ltd., thickness: 1 mm) having an indium-doped $SnO_2$ layer on its surface was provided as the substrate 1 and the first electrode 2.

A niobium oxide layer serving as the second electron transport layer 3b was formed on the first electrode 2. For the formation of the niobium oxide layer, a sputtering method was employed. A film-forming material used for the formation of the niobium oxide layer was available from Geomatec Co., Ltd.

A niobium oxide fluoride layer serving as the first electron transport layer 3a was formed on the second electron transport layer 3b. For the formation of the niobium oxide fluoride layer, a spin coating method was employed. The specific formation method is described below.

An ethanol solution containing niobium fluoride ($NbF_5$, available from Sigma-Aldrich) was prepared. The solution had a niobium fluoride concentration of 0.05 mol/L. Next, 80 μL of the above solution was applied by spin coating onto the second electron transport layer 3b to form a coating film. The coating film was heat-treated at 80° C. for 120 minutes in a dry atmosphere to form the niobium oxide fluoride layer. A hot plate was used for the heat treatment.

The photoelectric conversion layer 4 containing a tin-based perovskite compound was formed on the first electron transport layer 3a. For the formation of the photoelectric conversion layer 4, a spin coating method was employed. A specific formation method is described below.

A coating solution containing $SnI_2$, $SnF_2$, and FAI (all available from Sigma-Aldrich) was prepared. A solvent for the coating solution was a solvent mixture of DMSO and DMF. The mixing ratio of DMSO to DMF in the solvent was 1:1 (by volume). The coating solution had a $SnI_2$ concentration of 1.2 mol/L. The coating solution had a $SnF_2$ concentration of 1.2 mol/L. The coating solution had an FAI concentration of 1.2 mol/L. Next, 80 μL of the coating solution was applied by spin coating onto the first electron transport layer 3a to form a coating film. The formation of the coating film was performed in a glove box kept under a nitrogen atmosphere. The coating film had a thickness of 500 nm. The coating film was heat-treated at 120° C. for 30 minutes to form the photoelectric conversion layer 4. A hot plate was used for the heat treatment. The formed photoelectric conversion layer 4 mainly contained a tin-based perovskite compound represented by the chemical formula $HC(NH_2)_2SnI_3$ (hereinafter, referred to as "$FASnI_3$"). The energy level of the conduction band minimum of the perovskite compound represented by the chemical formula $FASnI_3$ was −3.57 eV. The energy level of the conduction band minimum of the perovskite compound was measured by the same method as a method for measuring the energy level of the conduction band minimum of an electron transport material described in the item [Measurement of Energy Offset] below. Here, the stack in a state in which the photoelectric conversion layer 4 had been formed and the hole transport layer 5 had not been formed yet in the process of producing the solar cell was selected as an evaluation sample.

Next, 80 μL of a toluene solution containing PTAA (available from Sigma-Aldrich) in a concentration of 10 mg/mL was applied by spin coating onto the photoelectric conversion layer 4 to form the hole transport layer 5. The formation of the hole transport layer 5 was performed in a glove box. The thickness of the hole transport layer 5 was determined by cross-sectional analysis with a scanning electron microscope (FEI Helios G3).

Finally, a gold layer having a thickness of 120 nm was deposited by vapor deposition on the hole transport layer 5 to form the second electrode 6. In this way, the solar cell of Example 1 was produced.

Example 2

A solar cell of Example 2 was produced as in Example 1, except that the heat-treatment temperature of the coating film to form the first electron transport layer 3a was changed to 100° C.

Example 3

A solar cell of Example 3 was produced as in Example 1, except that the heat-treatment temperature of the coating film to form the first electron transport layer 3a was changed to 120° C.

Example 4

A solar cell of Example 4 was produced as in Example 1, except that the heat-treatment temperature of the coating film to form the first electron transport layer 3a was changed to 140° C.

Example 5

A solar cell of Example 5 was produced as in Example 1, except that the heat-treatment temperature of the coating film to form the first electron transport layer 3a was changed to 160° C.

Example 6

A solar cell of Example 6 was produced as in Example 1, except that the solution used to form the first electron transport layer 3a was changed from the ethanol solution containing niobium fluoride to a DMF solution containing niobium chloride ($NbCl_5$, available from Sigma-Aldrich). The DMF solution had a niobium chloride concentration of 0.05 mol/L.

Example 7

The heat-treatment temperature of the coating film to form the first electron transport layer 3a was changed to 120° C. The solution used to form the first electron transport layer 3a was changed from the ethanol solution containing niobium fluoride to the DMF solution containing niobium chloride used in Example 6. Except for these points, a solar cell of Example 7 was produced as in Example 1.

Comparative Example 1

A solar cell of Comparative example 1 was produced as in Example 1, except that the first electron transport layer 3a was not formed.

Comparative Example 2

A solar cell of Comparative example 2 was produced as in Example 1, except that the photoelectric conversion layer mainly containing a lead-based perovskite compound represented by the chemical formula $HC(NH_2)_2PbI_3$ (hereinafter, referred to as "$FAPbI_3$") in place of $FASnI_3$ was formed. The photoelectric conversion layer of Comparative example 2 was formed in the same manner as the photoelectric conversion layer of Example 1, except that the coating solution containing $PbI_2$ in place of $SnI_2$ and containing no $SnF_2$ was used.

Comparative Example 3

A solar cell of Comparative example 3 was produced as in Comparative example 2, except that the solution used to form the first electron transport layer 3a was changed from the ethanol solution containing niobium fluoride to the DMF solution containing niobium chloride used in Example 6.

Evaluation of Composition

The composition ratio X/Nb of the halogen element to niobium at a surface of the first electron transport layer 3a adjacent to the photoelectric conversion layer was evaluated by XPS. The composition ratio X/Nb of the halogen element to niobium at the surface of the first electron transport layer 3a adjacent to the photoelectric conversion layer was evaluated with an XPS measurement system (trade name: PHI 5000 VersaProbe, available from ULVAC-PHI, Inc). The evaluation was performed as described below.

Each of the solar cells of Examples and Comparative Examples was etched in the thickness direction from the main surface on the side of the second electrode 6. Etching was performed at a constant etching rate. For each etching cycle, the exposed surface was subjected to elemental composition analysis by XPS. The etching was performed by sputtering with argon. The exposed surface was determined as a surface of the first electron transport layer 3a, where niobium contained in the first electron transport layer 3a served as a first element, and niobium and tin were detected in approximately the same amount by mole. The surface of the first electron transport layer 3a is also the interface between the first electron transport layer 3a and the photoelectric conversion layer. The composition ratio X/Nb at the determined surface was evaluated by XPS. The etching and the elemental composition analysis were performed without exposing the solar cell to air. The solar cell was transported in a nitrogen atmosphere.

Measurement of Energy Offset

The energy offset between the electron transport material contained in the first electron transport layer 3a and the photoelectric conversion material contained in the photoelectric conversion layer was evaluated by ultraviolet photoelectron spectroscopy measurement and transmittance measurement. The evaluation was performed as described below.

In the process of producing each of the solar cells of Examples and Comparative examples, the stack in the state in which the first electron transport layer 3a had been formed and the photoelectric conversion layer had not been formed yet was selected as an evaluation sample. The evaluation sample was subjected to ultraviolet photoelectron spectroscopy measurement with the above XPS measurement system to measure the energy level of the valence band maximum of the electron transport material. The transmittance of the evaluation sample was measured with a transmittance measuring device (available from Shimadzu Corporation, trade name: SlidSpec-3700), and the band gap of the electron transport material was calculated from the measured transmittance. The energy level of the conduction band minimum of the electron transport material was calculated from the obtained energy level of the valence band maximum and the band gap. The energy offset was calculated by subtracting −3.5 eV, which was the energy level of the conduction band minimum of the photoelectric conversion material $FASnI_3$, or −4.0 eV, which was the energy level of the conduction band minimum of $FAPbI_3$, from the calculated energy level of the conduction band minimum.

Determination of Halogen

The distribution of halogens in the first electron transport layer 3a was determined by TOF-SIMS. As a TOF-SIMS measuring device, TOF.SIMS5-200 available by ION-TOF was used. The evaluation was performed as described below.

Each of the solar cells of Examples and Comparative Examples was etched in the thickness direction from the main surface on the side of the second electrode 6 toward the first electrode 2. The etching was performed at a constant etching rate, and the distribution of elements at the exposed surface was determined by TOF-SIMS for each etching cycle. The etching was performed by sputtering. A gas cluster ion beam (GCIB) was used as a sputter-ion source. The etching and TOF-SIMS were performed without exposing the solar cell to air. The solar cell was transported in a nitrogen atmosphere.

Figure 4:
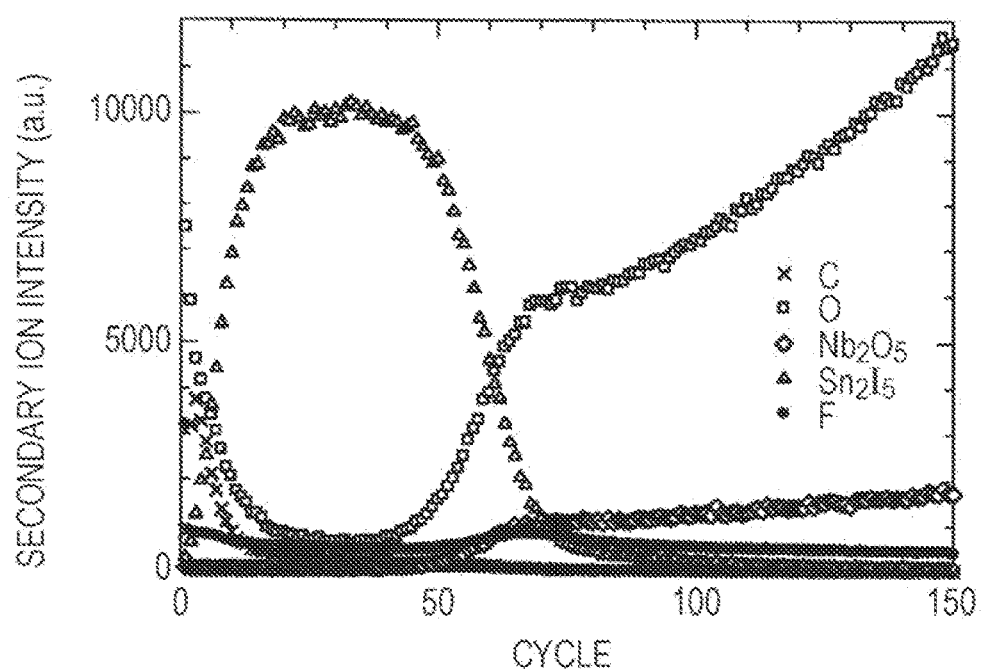
FIG. 4 is a graph illustrating the evaluation results of a solar cell of Comparative example 1 by time-of-flight secondary ion mass spectrometry (hereinafter, referred to as "TOF-SIMS")
Figure 5:
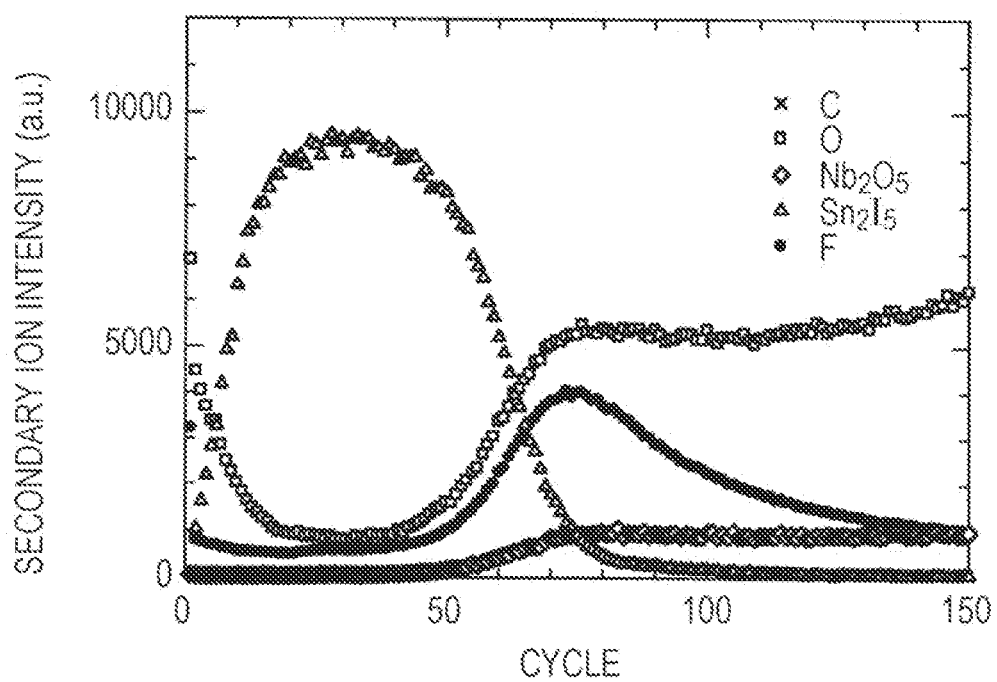
FIG. 5 is a graph illustrating the evaluation results of a solar cell of Example 3 by TOF-SIMS.

FIG. 4 is a TOF-SIMS spectrum of a region including the photoelectric conversion layer and the second electron transport layer 3b in the solar cell of Comparative example 1. FIG. 5 is a TOF-SIMS spectrum of a region including the photoelectric conversion layer 4, the first electron transport layer 3a, and the second electron transport layer 3b in the solar cell of Example 3. The values along the horizontal axis in each of FIGS. 4 and 5 are the number of etching cycles and correspond to the positions of the exposed surfaces evaluated in the thickness direction. The measured intensity of F (that is, fluorine) was much higher than those of other elements. For this reason, in FIGS. 4 and 5, only the intensity of F is plotted by converting the measured values to 1/10 thereof. As illustrated in FIG. 4, in Comparative example 1, only a very weak distribution of F was obtained over the entire area of the photoelectric conversion layer 4 and the second electron transport layer 3b. In Comparative example 1, F distributed seemed to originate from $SnF_2$ added to the photoelectric conversion layer. The region of the photoelectric conversion layer in FIG. 4 is a region where the intensity of $Sn_2I_5$ depicted by the triangular markers is relatively high (that is, between about 5 and about 70 cycles). The region of the second electron transport layer 3b is a region where the intensity of $Nb_2O_5$ depicted by the diamond-shaped markers is relatively high (that is, greater than or equal to 70 cycles). As illustrated in FIG. 5, in Example 3, strong F segregation was found near the surface of the first electron transport layer 3a adjacent to the photoelectric conversion layer 4. The F concentration at the surface of the first electron transport layer 3a adjacent to the photoelectric conversion layer 4 was higher than that at the surface adjacent to the second electron transport layer 3b. The first electron transport layer 3a had a concentration gradient in which the F concentration reached a peak near the surface adjacent to the photoelectric conversion layer 4 and then decreased gradually toward the second electron transport layer 3b. In FIG. 5, the surface of the first electron transport layer 3a adjacent to the photoelectric conversion layer 4 is located at the overlap between a region where the intensity of Sn2I5 depicted by the triangular markers decreases and a region where the intensity of Nb2O5 depicted by the diamond markers increases as the number of cycles increases (i.e., between about 60 and about 80 cycles). The surface of the first electron transport layer 3a adjacent to the second electron transport layer 3b is estimated to be between 100 and 150 cycles.

Evaluation of Solar Cell Characteristics

The conversion efficiency of each of the solar cells of Examples and Comparative examples was evaluated with a solar simulator (available from Bunkoukeiki Co., Ltd., trade name: BPS X300BA). The evaluation was performed using simulated sunlight having an illuminance of 100 mW/cm$^2$.

Table 1 below presents the photoelectric conversion material, the electron transport material contained in the electron transport layer in contact with the photoelectric conversion layer, and the energy offset for each of the solar cells of Examples and Comparative examples.

TABLE 1

|  | Electron transport material | Photoelectric conversion material | Energy offset (eV) |
| --- | --- | --- | --- |
| Examples 1 to 5 | niobium oxide fluoride | FASnI$_3$ | −0.1 |
| Examples 6 and 7 | niobium oxide chloride | FASnI$_3$ | −0.1 |
| Comparative example 1 | niobium oxide | FASnI$_3$ | +0.2 |
| Comparative example 2 | niobium oxide fluoride | FAPbI$_3$ | +0.4 |
| Comparative example 3 | niobium oxide chloride | FAPbI$_3$ | +0.4 |

Table 1 indicates that a small energy offset of −0.1 eV was achieved in the combination of the photoelectric conversion material of FASnI$_3$, which is the tin-based perovskite compound, and the electron transport material of niobium oxide fluoride or niobium oxide chloride. As mentioned above, when the electron transport material is TiO$_2$, the energy offset is −0.5 eV. The energy level of the conduction band minimum of niobium oxide fluoride or niobium oxide chloride was energetically deeper than the energy level of the conduction band minimum of FASnI$_3$. The combination of the photoelectric conversion material of FASnI$_3$ and the electron transport material of niobium oxide resulted in a larger energy offset of +0.2 eV. The combination of the photoelectric conversion material of FAPbI3, which is the lead-based perovskite compound, and the electron transport material of niobium oxide fluoride or niobium oxide chloride resulted in an even larger energy offset of +0.4 eV.

Table 2 presents the photoelectric conversion material, the electron transport material contained in the electron transport layer in contact with the photoelectric conversion layer, the composition ratio F/Nb (mole ratio) in the electron transport layer at the interface with the photoelectric conversion layer, the composition ratio Cl/Nb (mole ratio) in the electron transport layer at the interface with the photoelectric conversion layer, and the conversion efficiency of each of the solar cells in Examples and Comparative examples.

TABLE 2

|  | Electron transport material | Photoelectric conversion material | Composition ratio F/Nb in electron transport layer at interface with photoelectric conversion layer (mole ratio) | Composition ratio Cl/Nb in electron transport layer at interface with photoelectric conversion layer (mole ratio) | Conversion efficiency (%) |
| --- | --- | --- | --- | --- | --- |
| Example 1 | niobium oxide fluoride | FASnI$_3$ | 0.796 | 0.000 | 2.30 |
| Example 2 | niobium oxide fluoride | FASnI$_3$ | 0.522 | 0.000 | 2.65 |

TABLE 2-continued

|  | Electron transport material | Photoelectric conversion material | Composition ratio F/Nb in electron transport layer at interface with photoelectric conversion layer (mole ratio) | Composition ratio Cl/Nb in electron transport layer at interface with photoelectric conversion layer (mole ratio) | Conversion efficiency (%) |
|---|---|---|---|---|---|
| Example 3 | niobium oxide fluoride | FASnI$_3$ | 0.307 | 0.000 | 2.68 |
| Example 4 | niobium oxide fluoride | FASnI$_3$ | 0.044 | 0.000 | 2.42 |
| Example 5 | niobium oxide fluoride | FASnI$_3$ | 0.012 | 0.000 | 2.29 |
| Example 6 | niobium oxide chloride | FASnI$_3$ | 0.000 | 0.107 | 2.17 |
| Example 7 | niobium oxide chloride | FASnI$_3$ | 0.000 | 0.013 | 2.25 |
| Comparative example 1 | niobium oxide | FASnI$_3$ | 0.000 | 0.000 | 2.01 |
| Comparative example 2 | niobium oxide fluoride | FAPbI$_3$ | 0.307 | 0.000 | 1.57 |
| Comparative example 3 | niobium oxide chloride | FAPbI$_3$ | 0.000 | 0.107 | 1.37 |

Table 2 indicates that each of the solar cells of Examples exhibited higher conversion efficiency than the solar cells of Comparative examples.

The solar cells of the present disclosure can be used in various applications including those for solar cells in the related art.

What is claimed is:

1. A solar cell, comprising:
a first electrode;
a second electrode;
a photoelectric conversion layer located between the first electrode and the second electrode; and
a first electron transport layer located between the first electrode and the photoelectric conversion layer,
wherein at least one selected from the group consisting of the first electrode and the second electrode is translucent,
the photoelectric conversion layer contains a perovskite compound composed of a monovalent cation, a Sn cation, and a halogen anion, and
the first electron transport layer contains a niobium oxide halide, wherein a halogen contained in the niobium oxide halide is F and the molar composition ratio of F/Nb is from 0.012 to 0.796.

2. The solar cell according to claim 1,
wherein the first electron transport layer has a first main surface and a second main surface,
the first main surface faces the photoelectric conversion layer, and the second main surface faces the first electrode, and
the first main surface has a higher halogen concentration than the second main surface.

3. The solar cell according to claim 1,
wherein the first electron transport layer has a concentration gradient in which a halogen concentration decreases in a direction from the photoelectric conversion layer to the first electrode in at least a portion of a region of the first electron transport layer extending in a thickness direction of the first electron transport layer.

4. The solar cell according to claim 1, further comprising:
a second electron transport layer located between the first electron transport layer and the first electrode,
wherein the second electron transport layer contains niobium oxide.

5. The solar cell according to claim 4,
wherein the first electron transport layer is in contact with the photoelectric conversion layer and the second electron transport layer.

6. The solar cell according to claim 1,
wherein the monovalent cation is a formamidinium cation.

7. A solar cell, comprising:
a first electrode;
a second electrode;
a photoelectric conversion layer located between the first electrode and the second electrode; and
a first electron transport layer located between the first electrode and the photoelectric conversion layer,
wherein at least one selected from the group consisting of the first electrode and the second electrode is translucent,
the photoelectric conversion layer contains a perovskite compound composed of a monovalent cation, a Sn cation, and a halogen anion, and
the first electron transport layer contains a niobium oxide halide, wherein a halogen contained in the niobium oxide halide is Cl and the molar composition ratio of Cl/Nb is from 0.013 to 0.107.

8. The solar cell according to claim 7,
wherein the first electron transport layer has a first main surface and a second main surface,
the first main surface faces the photoelectric conversion layer, and the second main surface faces the first electrode, and
the first main surface has a higher halogen concentration than the second main surface.

9. The solar cell according to claim 7,
wherein the first electron transport layer has a concentration gradient in which a halogen concentration decreases in a direction from the photoelectric conversion layer to the first electrode in at least a portion of a region of the first electron transport layer extending in a thickness direction of the first electron transport layer.

10. The solar cell according to claim 7,
wherein the monovalent cation is a formamidinium cation.

11. The solar cell according to claim 7, further comprising:
a second electron transport layer located between the first electron transport layer and the first electrode, wherein the second electron transport layer contains niobium oxide.

12. The solar cell according to claim 11,
wherein the first electron transport layer is in contact with the photoelectric conversion layer and the second electron transport layer.

* * * * *